US012660079B2

(12) United States Patent
Sugai et al.

(10) Patent No.: US 12,660,079 B2
(45) Date of Patent: Jun. 16, 2026

(54) WIRING BOARD AND ELECTRONIC DEVICE

(71) Applicant: KYOCERA Corporation, Kyoto (JP)

(72) Inventors: Kouichirou Sugai, Kyoto (JP); Shinya Higuchi, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 203 days.

(21) Appl. No.: 18/572,424

(22) PCT Filed: Jun. 27, 2022

(86) PCT No.: PCT/JP2022/025487

§ 371 (c)(1),
(2) Date: Dec. 20, 2023

(87) PCT Pub. No.: WO2023/276923

PCT Pub. Date: Jan. 5, 2023

(65) Prior Publication Data

US 2024/0292516 A1     Aug. 29, 2024

(30) Foreign Application Priority Data

Jun. 29, 2021     (JP) ................................. 2021-108105

(51) Int. Cl.
| | |
|---|---|
| *H05K 1/02* | (2006.01) |
| *H01L 23/12* | (2006.01) |
| *H01P 3/08* | (2006.01) |
| *H01S 5/022* | (2021.01) |

(52) U.S. Cl.
CPC .......... *H05K 1/0219* (2013.01); *H01P 3/081* (2013.01); *H01S 5/022* (2013.01); *H05K 2201/0979* (2013.01)

(58) Field of Classification Search
CPC .. H05K 1/0237; H05K 1/0216; H05K 1/0218; H05K 2201/0979
See application file for complete search history.

(56) References Cited

U.S. PATENT DOCUMENTS

| | | | |
|---|---|---|---|
| 2014/0034363 A1 | 2/2014 | Biddle | |
| 2014/0034376 A1* | 2/2014 | Biddle | H05K 1/118 174/268 |
| 2015/0229016 A1 | 8/2015 | Biddle | |
| 2017/0310078 A1* | 10/2017 | Hirayama | H01S 5/02345 |

FOREIGN PATENT DOCUMENTS

| | | | |
|---|---|---|---|
| CN | 104488135 A | | 4/2015 |
| JP | 2000-340700 A | | 12/2000 |
| JP | 2002-252505 A | | 9/2002 |
| JP | 2016181737 A | * | 10/2016 |
| JP | 2017-199906 A | | 11/2017 |

* cited by examiner

*Primary Examiner* — Timothy J Thompson
*Assistant Examiner* — Amol H Patel
(74) *Attorney, Agent, or Firm* — Volpe Koenig

(57) ABSTRACT

To sufficiently reduce transmission loss and noise of a signal. A signal wire is located on a first surface of an insulation substrate, a first ground and a second ground are located on the first surface of the insulation substrate with the signal wire interposed therebetween, a via conductor electrically connecting the first ground and the lower ground is located at least one of on a second surface of the insulation substrate or inside the insulation substrate, and a side-surface metal layer electrically connecting the second ground and the lower ground is located on a third surface of the insulation substrate.

14 Claims, 8 Drawing Sheets

WIRING BOARD AND ELECTRONIC DEVICE

TECHNICAL FIELD

The present disclosure relates to a wiring board and an electronic device.

BACKGROUND OF INVENTION

Communication devices used for information communication systems are becoming more compatible with high frequencies. Also in a wiring board used for a communication device, transmission loss and noise of a signal (high-frequency signal) are reduced by, for example, the following configuration.

In a wiring board described in Patent Document 1, a first ground and a second ground are located on an upper surface that is a first surface of an insulation substrate with a signal wire interposed therebetween. A lower ground is located on a lower surface that is a second surface of the insulation substrate, and the lower ground faces the signal wire, the first ground, and the second ground with the insulation substrate interposed therebetween. A first via electrically connecting the first ground and the lower ground is located inside the insulation substrate. A second via electrically connecting the second ground and the lower ground is located inside the insulation substrate.

CITATION LIST

Patent Literature

Patent Document 1: JP 2000-340700 A

SUMMARY

A wiring board according to the present disclosure includes: an insulation substrate comprising a first surface, a second surface located opposite to the first surface, and a third surface connected to each of the first surface and the second surface; a signal wire located on the first surface and extending in a first direction; a first ground located farther away from the third surface than the signal wire is and a second ground located closer to the third surface than the signal wire is, the first ground and the second ground being located on the first surface with the signal wire interposed between the first ground and the second ground; a lower ground located at least one of on the second surface of the insulation substrate or inside the insulation substrate; a via conductor located inside the insulation substrate and electrically connecting the first ground and the lower ground; and a side-surface metal layer located on the third surface. In the wiring board, the side-surface metal layer is located on the third surface and electrically connects the second ground and the lower ground.

An electronic device according to the present disclosure includes: the wiring board described above; an electronic component mounted on the wiring board; a bonding material located on the second surface of the insulation substrate; and a mounting substrate bonded to the wiring board via the bonding material.

DESCRIPTION OF EMBODIMENTS

Figure 1:
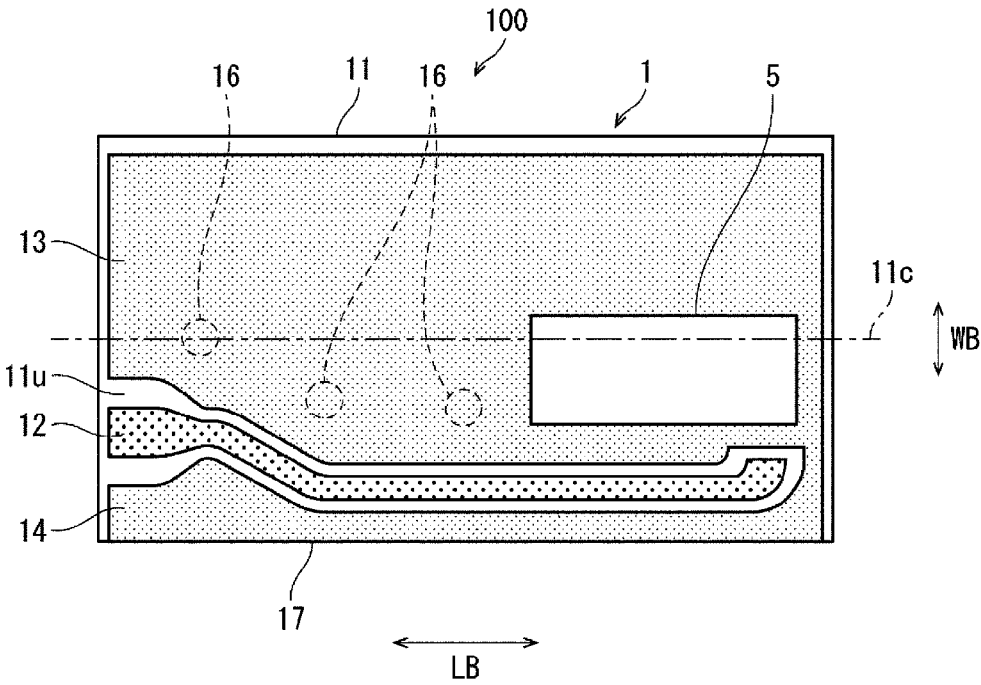
FIG. 1 is a schematic plan view of an electronic device according to a first embodiment.

A wiring board and an electronic device according to embodiments of the present disclosure will be described below in detail with reference to the drawings. However, each of the figures, which will be referred to below, is a simplified representation of only components necessary for description of the embodiments, for convenience of description. Accordingly, the wiring board and the electronic device according to the embodiments of the present disclosure may be provided with an optional component that is not illustrated in the referenced drawings. In addition, the dimensions of the components in the drawings do not faithfully represent the actual dimensions of the components, the dimension ratios of the members, and the like.

In the present disclosure, a "first direction" is a left-right direction in the plan view illustrated in FIG. 1. In addition, a second direction is a vertical direction in the plan view illustrated in FIG. 1, in other words, a direction orthogonal to the first direction on a first surface. A third direction is a thickness direction of an insulation substrate and is a direction orthogonal to the first direction and the second direction. The third direction is the vertical direction in a side view. In the side view and the cross-sectional view of the present disclosure, a first surface of the insulation substrate is located on an upper side, and a second surface of the insulation substrate is located on a lower side. In addition, in the drawings of the present disclosure, "LB" indicates the first direction, "WB" indicates the second direction, "TB" indicates the third direction, "U" indicates the upper side, and "D" indicates the lower side. In the drawings of the present disclosure, the cross-sectional portions are hatched and the surfaces of the conductor portions are dotted.

First Embodiment

Figure 2:
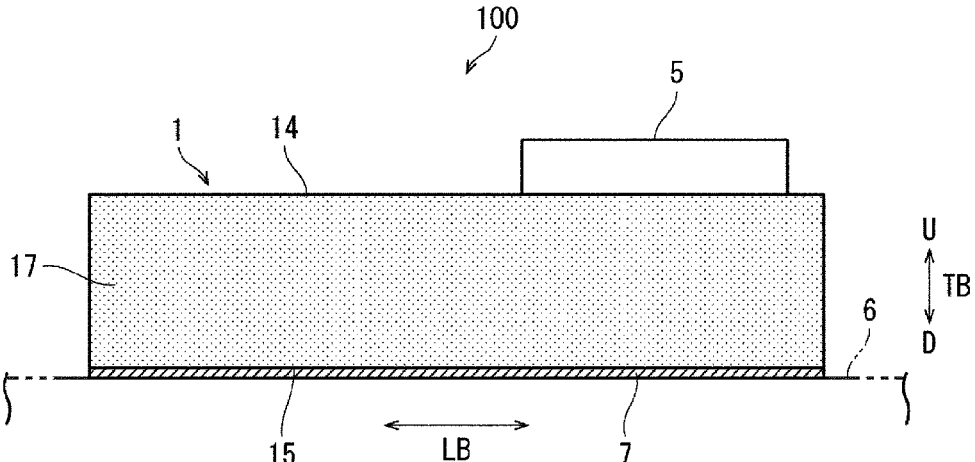
FIG. 2 is a schematic side view of the electronic device illustrated in FIG. 1 as viewed from a second direction.
Figure 3:
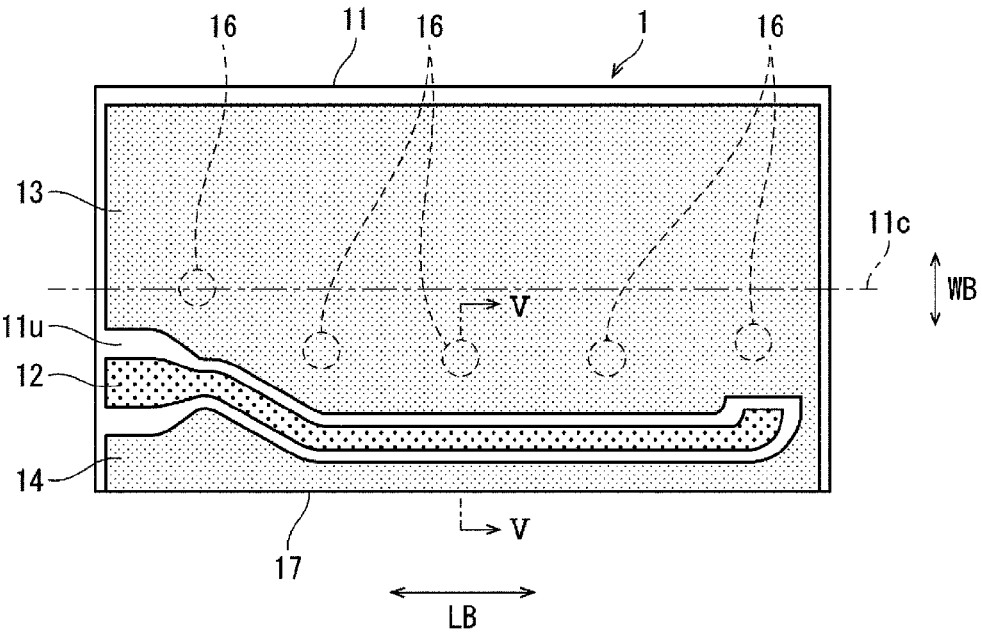
FIG. 3 is a schematic plan view of a wiring board according to the first embodiment.
Figure 4:
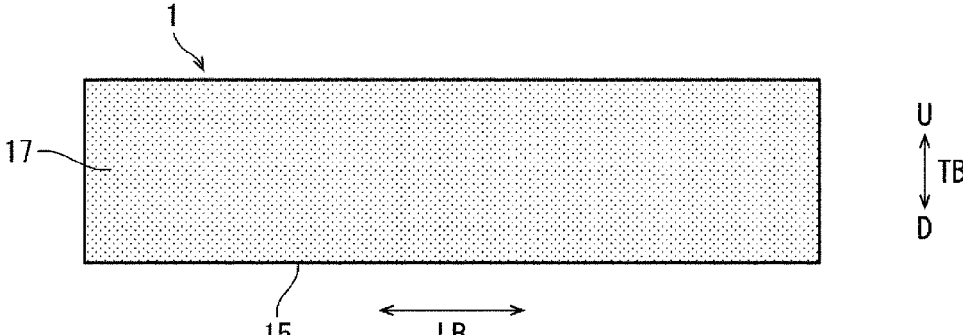
FIG. 4 is a schematic side view of the wiring board illustrated in FIG. 3 as viewed from the second direction.
Figure 5:
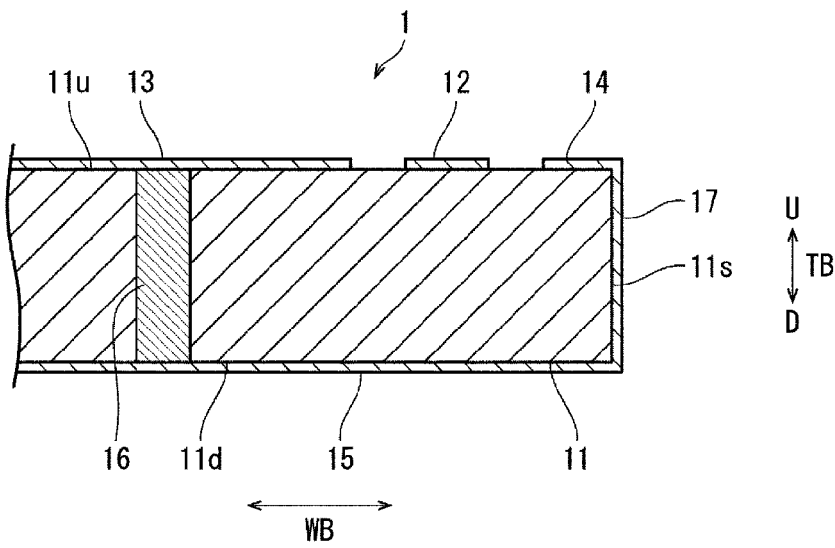
FIG. 5 is a schematic cross-sectional view taken along a line V-V in FIG. 3.
Figure 6:
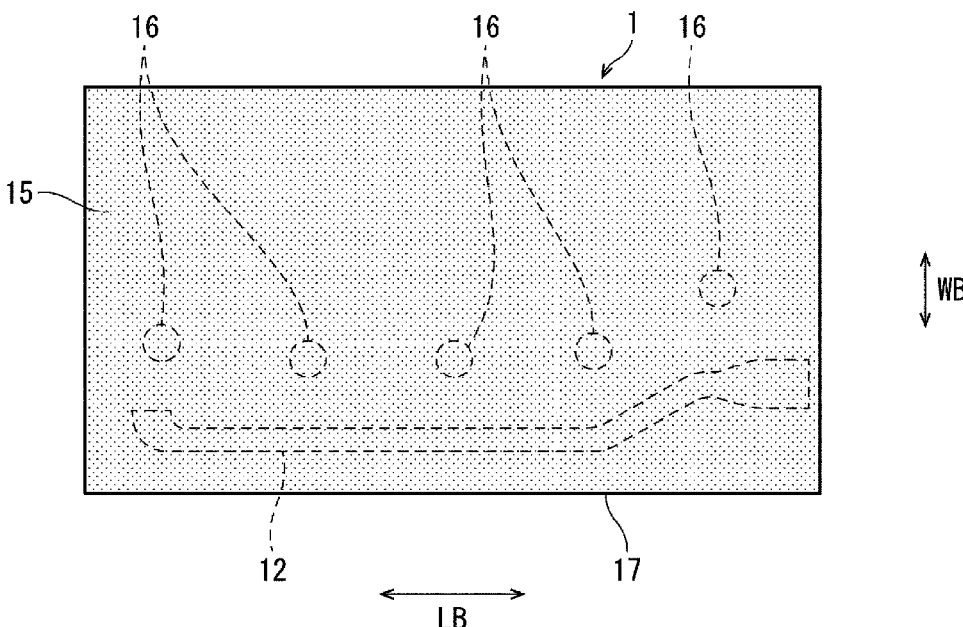
FIG. 6 is schematic bottom view of the wiring board illustrated in FIG. 3.

A first embodiment of the present disclosure will be described with reference to FIG. 1 to FIG. 6. FIG. 1 is a schematic plan view of an electronic device according to a first embodiment. FIG. 2 is a schematic side view of the electronic device illustrated in FIG. 1 as viewed from a second direction. FIG. 3 is a schematic plan view of a wiring board according to the first embodiment. FIG. 4 is a schematic side view of the wiring board illustrated in FIG. 3 as viewed from the second direction. FIG. 5 is a schematic cross-sectional view taken along a line V-V in FIG. 3. FIG. 6 is schematic bottom view of the wiring board illustrated in FIG. 3.

(Outline of Electronic Device 100)

An electronic device 100 according to the first embodiment illustrated in FIGS. 1 and 2 is used for an optical transceiver (not illustrated). The electronic device 100 includes a wiring board 1, an electronic component 5 mounted on the wiring board 1, a bonding material 7 located on a second surface of an insulation substrate, and a mounting substrate 6 bonded to the wiring board 1 via the bonding material 7. In the present disclosure, the electronic component 5 may be, for example, a laser diode that converts an electrical signal into an optical signal. Although not illustrated, the optical transceiver may include an optical fiber that transmits an optical signal and a lens located between the laser diode and an incident end of the optical fiber. The lens causes the optical signal converted by the laser diode to exit toward the incident end of the optical fiber. The mounting substrate 6 may be an insulation substrate or the like made of a ceramic or a resin. The electronic device 100 may also be used for a communication device other than the optical transceiver.

(Configuration of Wiring Board 1)

As in the example illustrated in FIGS. 3 to 6, the wiring board 1 may include an insulation substrate 11 having a rectangular plate shape. The insulation substrate 11 may be made of, for example, a ceramic, such as an aluminum oxide sintered body (alumina ceramic), an aluminum nitride sintered body, a mullite sintered body, or a glass ceramic sintered body. The insulation substrate 11 may be composed of one or more insulation layers. The insulation substrate 11 may have a first surface 11$u$, a second surface 11$d$ located opposite to the first surface 11$u$, and a third surface 11$s$ connected to each of the first surface 11$u$ and the second surface 11$d$. In each drawing, an example in which an angle formed between the first surface 11$u$ and the third surface 11$s$ of the insulation substrate 11 is 90° and an angle formed between the second surface 11$d$ and the third surface 11$s$ of the insulation substrate 11 is 90° is illustrated, but the present disclosure is not limited thereto. Note that the side surfaces other than the third surface 11$s$ (the other surfaces where the first surface 11$u$ and the second surface 11$d$ are connected) are not particularly limited.

A signal wire 12 that transmits a signal (high-frequency signal) for driving the electronic component 5 may be located on the first surface 11$u$ of the insulation substrate 11. The signal wire 12 may be made of a metal material containing, for example, titanium (Ti), platinum (Pt), and gold (Au). The signal wire 12 may extend in the first direction on the first surface 11$u$ of the insulation substrate 11. The signal wire 12 may be disposed from the vicinity of one end portion of the insulation substrate 11 in the first direction to the vicinity of the other end portion thereof. The signal wire 12 may be bent in a plan view. As illustrated in the example of the side view of FIG. 2, since the third surface 11$s$ has a rectangular shape whose long side extends in the first direction, it can be said that the signal wire 12 extends in a direction along the third surface 11$s$.

The signal wire 12 may be located close to the third surface 11$s$ with respect to a center position 11$c$, in the second direction, of the insulation substrate 11. In other words, the signal wire 12 may deviate toward the third surface 11$s$ with respect to the center position 11$c$, in the second direction, of the insulation substrate 11. A proportion of deviation of the signal wire 12 with respect to the center position 11$c$, in the second direction, of the insulation substrate 11 may be 25% or more. The proportion of deviation of the signal wire 12 refers to a ratio of an amount of deviation of a center position of the signal wire 12 with respect to the center position 11$c$, in the second direction, of the insulation substrate 11 to a half-length, in the second direction, of the insulation substrate 11. The case where the signal wire 12 is located close to the third surface 11$s$ with respect to the center position 11$c$, in the second direction, of the insulation substrate 11 means that the signal wire 12 is located close to a side-surface metal layer 17. With such a configuration, it is possible to further reduce the transmission loss of the signal transmitted by the signal wire 12. In addition, on the first surface 11$u$, the laser diode that is the electronic component 5 can be mounted at a central portion, in the second direction, of the wiring board 1 or at a position close to the central portion. Therefore, when the electronic device 100 is used for, for example, an optical transceiver, it is possible to reduce a positional deviation in the second direction between the lens of the optical transceiver and the wiring board 1 and to reduce a size of the optical transceiver.

On the first surface 11$u$ of the insulation substrate 11, a first ground 13 and a second ground 14 defining a reference potential may be located with the signal wire 12 interposed therebetween. The first ground 13 may be located farther away from the third surface 11$s$ of the insulation substrate 11 than the signal wire 12 is. The second ground 14 may be located closer to the third surface 11$s$ of the insulation substrate 11 than the signal wire 12 is. One end portion of the second ground 14 is connected to the first ground 13. Each of the first ground 13 and the second ground 14 may be made of a metal material containing, for example, titanium (Ti), platinum (Pt), and gold (Au). The insulation substrate 11 may be exposed at a portion between the signal wire 12 and the first ground 13 on the first surface 11$u$ of the insulation substrate 11. The insulation substrate 11 may be exposed at a portion between the signal wire 12 and the second ground 14 on the first surface 11$u$ of the insulation substrate 11.

The first ground 13 and the signal wire 12 may be insulated therebetween by the insulation substrate 11. A distance between the first ground 13 and the signal wire 12 need not be constant along the signal wire 12. In addition, the second ground 14 and the signal wire 12 are insulated therebetween by the insulation substrate 11. A distance between the second ground 14 and the signal wire 12 need not be constant along the signal wire 12.

A lower ground 15 that defines a reference potential may be located on the second surface 11$d$ of the insulation substrate 11. The lower ground 15 may face the signal wire 12, the first ground 13, and the second ground 14 with the insulation substrate 11 interposed between the lower ground 15 and the signal wire 12. In other words, the lower ground 15 may overlap the signal wire 12, the first ground 13, and the second ground 14 when the wiring board 1 is viewed in a plane perspective. The lower ground 15 may be made of a metal material containing, for example, titanium (Ti), platinum (Pt), gold (Au), and the like. The lower ground 15 and the signal wire 12 may be insulated therebetween by the insulation substrate 11.

As illustrated in FIG. 5, a via conductor 16 electrically connecting the first ground 13 and the lower ground 15 may be located inside the insulation substrate 11. The via conductor 16 may be made by metalizing metal powder containing tungsten (W), molybdenum (Mo), manganese (Mn), silver (Ag), copper (Cu) or the like as a component. The via conductor 16 is formed by embedding a metalized paste for the via conductor in a through-hole, which has been formed in a ceramic green sheet by a processing method such as punching processing or laser processing, by a screen printing method, a press-fitting method, or the like, and firing the paste together with a powder compact formed by layering one or more ceramic green sheets.

A plurality of via conductors 16 may be provided. In the example illustrated in FIG. 5, an upper end portion of each via conductor 16 may be connected to the first ground 13, and a lower end portion of each via conductor 16 may be connected to the lower ground 15. The plurality of via conductors 16 may be arranged at equal intervals along the signal wire 12. The plurality of via conductors 16 may be arranged at unequal intervals. When the wiring board 1 is viewed in a plane perspective, a distance between each via conductor 16 and the signal wire 12 may be the same or different. When the plurality of via conductors 16 are arranged, the shielding property of the signal wire 12 can be enhanced by the plurality of via conductors 16. Furthermore, when the plurality of via conductors 16 are arranged along the signal wire 12, the shielding property of the signal wire 12 can be further enhanced. Therefore, according to the first embodiment of the present disclosure, it is possible to further reduce the transmission loss of the signal transmitted by the signal wire 12.

The side-surface metal layer 17 electrically connecting the second ground 14 and the lower ground 15 may be located on the third surface 11s of the insulation substrate 11. The side-surface metal layer 17 may be made of a metal material such as Ti (titanium). A top edge portion of the side-surface metal layer 17 may be connected to an edge portion (an edge portion on the third surface 11s side) of the second ground 14. The top edge portion of the side-surface metal layer 17 may overlap the edge portion of the second ground 14. In the example illustrated in FIG. 1, a bottom edge portion of the side-surface metal layer 17 may be connected to an edge portion (an edge portion on the third surface 11s side) of the lower ground 15. The bottom edge portion of the side-surface metal layer 17 may overlap the edge portion of the lower ground 15.

When the side-surface metal layer 17 electrically connects the second ground 14 and the lower ground 15 each other, the shielding property of the signal wire 12 can be enhanced, as compared with a case where a via conductor electrically connecting the second ground 14 and the lower ground 15 is provided inside the insulation substrate 11. Therefore, it is possible to sufficiently reduce the transmission loss and noise of the signal (high-frequency signal) transmitted by the signal wire 12. In addition, a length of the insulation substrate 11 in the second direction can be reduced, as compared with a case where a via conductor electrically connecting the second ground 14 and the lower ground 15 is provided inside the insulation substrate 11. Therefore, miniaturization of the wiring board 1, in other words, miniaturization of the electronic device 100 can be achieved.

As in the example illustrated in FIGS. 2 and 4, the side-surface metal layer 17 may be disposed on the entire third surface 11s of the insulation substrate 11 so as to extend along the entire signal wire 12, and may be connected to the second ground 14 and the lower ground 15. The side-surface metal layer 17 may be disposed in a partial region of the third surface 11s of the insulation substrate 11 so as to extend along a half region (half length) or more of the signal wire 12 and may be connected to the second ground 14 and the lower ground 15.

The wettability of the third surface 11s of the insulation substrate 11 with respect to the bonding material 7 that bonds the insulation substrate 11 to the mounting substrate 6 may be lower than the wettability of the second surface 11d of the insulation substrate 11 with respect to the bonding material 7. For the insulation substrate 11, ceramics such as an aluminum oxide ($Al_2O_3$) sintered body, an aluminum nitride (AlN) sintered body, a silicon carbide (SiC) sintered body, a glass ceramic, and a silicon nitride ($Si_3N_4$) sintered body and insulation materials such as an epoxy resin, a polyimide resin, and a polyimide siloxane resin may be exemplified. The bonding material 7 contains a solder material (for example, gold tin or the like), a brazing material, or the like. The wettability of the third surface 11s of the insulation substrate 11 with respect to the bonding material 7 refers to the ease of wetting and spreading of the bonding material 7 on the side-surface metal layer 17 located on the third surface 11s of the insulation substrate 11. The wettability of the second surface 11d of the insulation substrate 11 with respect to the bonding material 7 refers to the ease of wetting and spreading of the bonding material 7 on the lower ground 15 located on the second surface 11d of the insulation substrate 11.

When the wettability of the third surface 11s of the insulation substrate 11 with respect to the bonding material 7 is lower than the wettability of the second surface 11d of the insulation substrate 11 with respect to the bonding material 7, it is possible to reduce creeping up of the bonding material 7 to the side-surface metal layer 17 and the second ground 14 when the insulation substrate 11 is bonded to the mounting substrate 6. Therefore, when the insulation substrate 11 is bonded to the mounting substrate 6, a difference in thermal expansion between both ends, in the second direction, of the insulation substrate 11 can be reduced to reduce an occurrence of cracking, chipping, or the like of the insulation substrate 11. In addition, when the insulation substrate 11 is bonded to the mounting substrate 6, it is possible to reduce floating of one side, in the second direction, of the insulation substrate 11. When the electronic device 100 (wiring board 1) is used for, for example, an optical transceiver, it is possible to reduce an inclination or the like of the electronic device 100 with respect to an installation position of the electronic device 100, improving the reliability of the optical transceiver.

Here, the signal wire 12, the first ground 13, and the second ground 14 form a coplanar line. The signal wire 12 and the lower ground 15 form a microstrip line. The first ground 13 is electrically connected to the lower ground 15 by the via conductor 16 and is maintained at the same potential as the lower ground 15. The second ground 14 is electrically connected to the lower ground 15 by the side-surface metal layer 17 and is maintained at the same potential as the lower ground 15.

(Manufacturing Process of Wiring Board 1)

When the insulation substrate 11 is made of, for example, an aluminum nitride sintered body, a slurry is fabricated by adding and mixing a suitable organic binder, a solvent, and the like to raw material powder of aluminum nitride (AlN), erbium oxide ($Er_2O_3$), yttrium oxide ($Y_2O_3$), or the like. A ceramic green sheet is fabricated by forming the slurry into a sheet shape by a doctor blade method, a calender roll method, or the like. Next, suitable punching processing is performed on the ceramic green sheet, and one or more ceramic green sheets are layered to fabricate a powder compact. The powder compact is fired at a high temperature (about 1800° C.) to fabricate a sintered body from which a plurality of insulation substrates 11 are to be obtained. Then, after a surface of the sintered body is polished, the sintered body is sliced to take out a plurality of insulation substrates 11 from the sintered body.

The via conductor 16 is made by metalizing metal powder containing tungsten (W), molybdenum (Mo), manganese (Mn), silver (Ag), copper (Cu), or the like as a component. The via conductor 16 is formed by embedding a conductive paste for the via conductor in a through-hole, which has been formed in a ceramic green sheet by a processing method such as punching processing or laser processing, by a screen printing method, a press-fitting method, or the like, and firing the paste together with a powder compact formed by layering one or more ceramic green sheets. The signal wire 12, the first ground 13, and the second ground 14 are metal layers containing titanium (Ti), platinum (Pt), gold (Au), and the like as components, and are formed on the first surface 11*u* (upper surface) of the sintered body whose surface has been polished, by a thin film forming method such as a vapor deposition method, an ion-plating method, or a sputtering method. The lower ground 15 is a metal layer containing titanium (Ti), platinum (Pt), gold (Au), and the like as components, and is formed on the second surface 11*d* (lower face) of the sintered body whose surface has been polished, by a thin film forming method such as a vapor deposition method, an ion-plating method, or a sputtering method.

The side-surface metal layer 17 is a metal layer containing titanium (Ti) or the like, for example, and is formed on the third surface 11*s* of the sliced insulation substrate 11 by a thin film forming method such as a vapor deposition method, an ion-plating method, or a sputtering method. The side-surface metal layer 17 may be a metal layer having the same configuration as those of the signal wire 12, the first ground 13, the second ground 14, and the lower ground 15, or may be a metal layer having a different configuration. For example, when the lower ground 15 is a metal layer of Ti/Pt/Au and the side-surface metal layer 17 is a metal layer of Ti, the wettability of the third surface 11*s* of the insulation substrate 11 can be made lower than the wettability of the second surface 11*d* of the insulation substrate 11 with respect to the bonding material 7.

According to the first embodiment of the present disclosure, by using the electronic device 100 (wiring board 1) for, for example, an optical transceiver, it is possible to obtain an optical transceiver that transmits a good optical signal while reducing the size of the optical transceiver, and to improve the reliability of the optical transceiver.

Another Aspect of First Embodiment

Another aspect of the first embodiment will be described with reference to FIG. 7.

Figure 7:
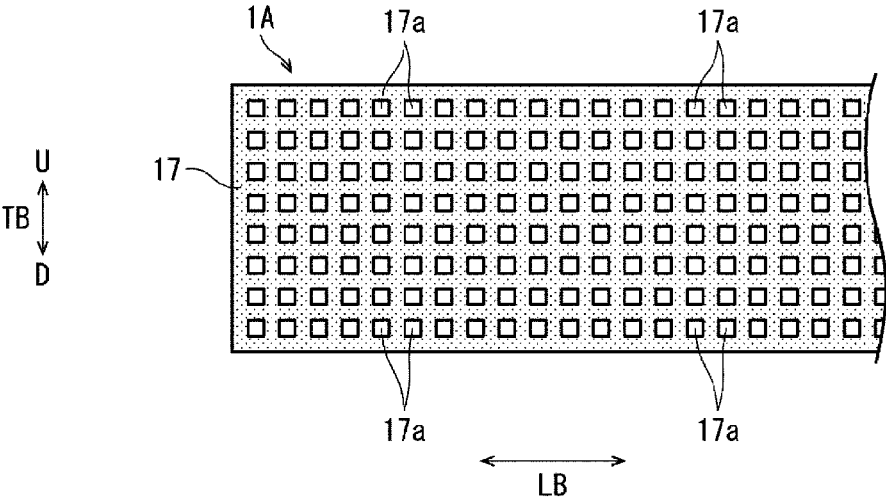
FIG. 7 is a schematic partial side view of a wiring board according to another aspect of the first embodiment as viewed from the second direction.

FIG. 7 is a schematic partial side view of a wiring board according to another aspect of the first embodiment as viewed from a second direction.

(Configuration of Wiring Board 1A)

As in the example illustrated in FIG. 7, in a wiring board 1A according to another aspect of the first embodiment, the side-surface metal layer 17 may be formed in, for example, a netlike shape or a perforated shape, and may have a plurality of openings 17*a*. The netlike shape includes a mesh shape, a lattice shape, a honeycomb shape, and the like. An opening area fraction of the side-surface metal layer 17 may be, for example, 80% or less.

When the side-surface metal layer 17 has a plurality of openings 17*a,* it is possible to reduce creeping up of the bonding material 7 to the side-surface metal layer 17 and the second ground 14 in bonding of the insulation substrate 11 to the mounting substrate 6. Therefore, according to another aspect of the first embodiment, when the insulation substrate 11 is bonded to the mounting substrate 6, a difference in thermal expansion between both ends, in the second direction, of the insulation substrate 11 can be reduced to reduce an occurrence of cracking, chipping, or the like of the insulation substrate 11. Furthermore, according to another aspect of the first embodiment, when the lower ground 15 is bonded to the mounting substrate 6, it is possible to reduce floating of one side, in the second direction, of the insulation substrate 11. According to another aspect of the first embodiment, when the electronic device 100 (wiring board 1A) is used for, for example, an optical transceiver, it is possible to reduce an inclination or the like of the electronic device 100 with respect to an installation position of the electronic device 100, improving the reliability of the optical transceiver.

In addition, according to another aspect of the first embodiment, the same operational effects as those of the first embodiment described above are obtained.

Second Embodiment

Figure 8:
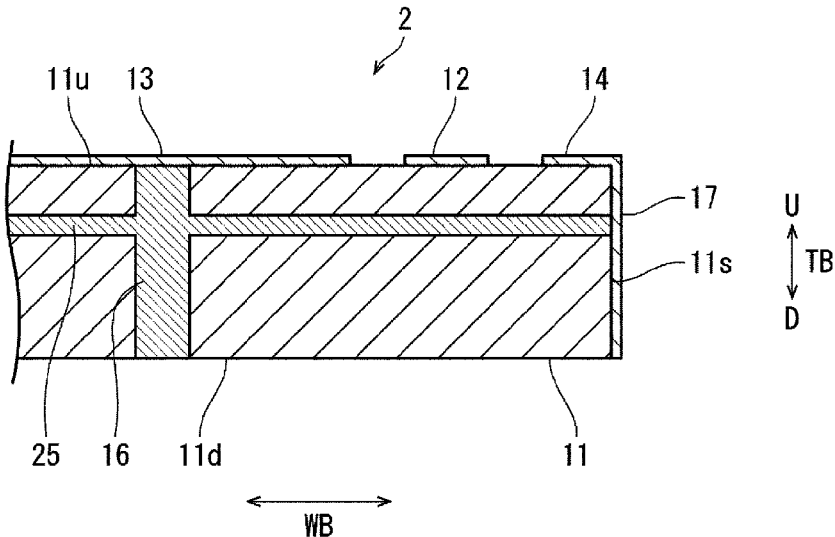
FIG. 8 is a schematic cross-sectional view of a wiring board according to a second embodiment, corresponding to FIG. 5.
Figure 9:
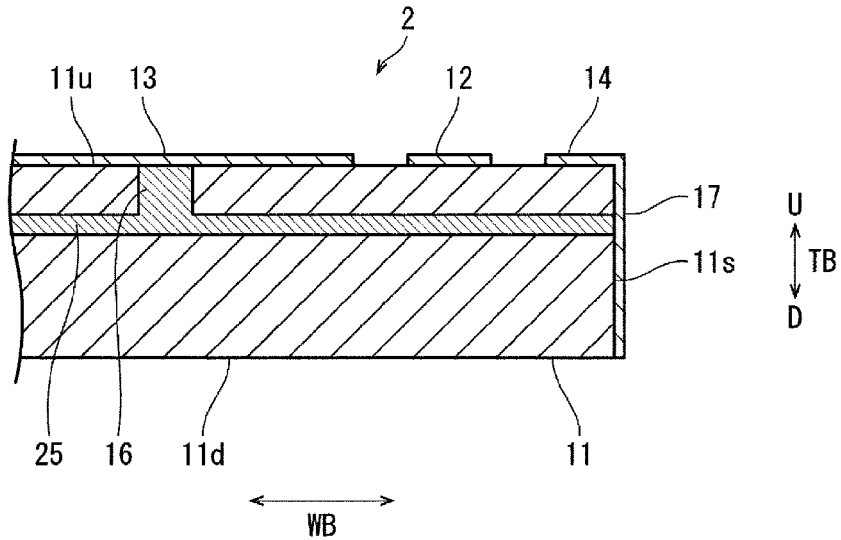
FIG. 9 is a schematic cross-sectional view of a wiring board according to another aspect of the second embodiment, corresponding to FIG. 5.

A second embodiment will be described with reference to FIGS. 8 and 9. FIG. 8 is a schematic cross-sectional view of a wiring board according to a second embodiment. FIG. 9 is a schematic cross-sectional view of a wiring board according to another aspect of the second embodiment.

(Configuration of Wiring Board 2)

As in the examples illustrated in FIGS. 8 and 9, a wiring board 2 according to the second embodiment has the same configuration as the wiring board 1 according to the first embodiment except for a part of the configuration. Among the configurations of the wiring board 2, a configuration different from that of the wiring board 1 according to the first embodiment will be described. For convenience of description, a member having the same function as a member described in the first embodiment is denoted by the same reference sign.

As illustrated in FIGS. 8 and 9, the wiring board 2 includes a first lower ground 25, as the lower ground. The first lower ground 25 is an example of the lower ground. In the wiring board 2 according to the second embodiment, instead of the lower ground 15 being located on the second surface 11*d* of the insulation substrate 11, the first lower ground 25 may be located inside the insulation substrate 11. As for the first lower ground 25, a part of the insulation substrate 11 may be interposed between the first lower ground 25 and the signal wire 12. In addition, the first lower ground 25 may face the signal wire 12, the first ground 13, and the second ground 14 with a part of the insulation substrate 11 interposed therebetween. In other words, the first lower ground 25 may overlap the signal wire 12, the first ground 13, and the second ground 14 when the wiring board 1 is viewed in a plane perspective. The first lower ground 25 and the signal wire 12 may be insulated therebetween by the insulation substrate 11. As illustrated in FIGS. 8 and 9, the first lower ground 25 and the side-surface metal layer 17 may be connected at the third surface 11s of the insulation substrate 11.

The first lower ground 25 may be located closer to the first surface 11u than to the second surface 11d of the insulation substrate 11. In other words, a distance between the first lower ground 25 and the first surface 11u of the insulation substrate 11 may be shorter than 50% of a thickness dimension of the insulation substrate 11. The case where the first lower ground 25 is located closer to the first surface 11u than to the second surface 11d of the insulation substrate 11 means that the first lower ground 25 is located close to the signal wire 12. With such a configuration, it is possible to further reduce the transmission loss of the signal transmitted by the signal wire 12, and to enhance the heat dissipation property of the electronic component 5 (see FIG. 1) mounted on the wiring board 2. When the wiring board 2 is used for, for example, an optical transceiver, it is possible to transmit a good optical signal, improving the reliability of the optical transceiver.

The via conductor 16 may electrically connect the first ground 13 and the first lower ground 25. When a plurality of via conductors 16 are provided, an upper end portion of each via conductor 16 may be connected to the first ground 13, and a lower portion of each via conductor 16 may be connected to the first lower ground 25.

As in the example illustrated in FIG. 8, each via conductor 16 may penetrate through the first lower ground 25 along the third direction. In this case, a lower end portion of each via conductor 16 may be exposed from the second surface 11d of the insulation substrate 11. In addition, as in the example illustrated in FIG. 9, each via conductor 16 need not penetrate through the first lower ground 25 along the third direction.

The side-surface metal layer 17 may electrically connect the second ground 14 and the first lower ground 25. A top edge portion of the side-surface metal layer 17 is connected to an edge portion (an edge portion closer to the third surface 11s) of the second ground 14. The top edge portion of the side-surface metal layer 17 may overlap the edge portion of the second ground 14. As in the example illustrated in FIGS. 8 and 9, the side-surface metal layer 17 may be connected to the edge portion of the first lower ground 25 exposed on the third surface 11s. An end portion of the first lower ground 25 may be exposed in a band shape on the third surface 11s along the first direction and may be connected to the side-surface metal layer 17 in a band shape.

Here, the signal wire 12, the first ground 13, and the second ground 14 form a coplanar line. The signal wire 12 and the first lower ground 25 form a microstrip line. The first ground 13 is electrically connected to the first lower ground 25 by the via conductor 16, and is maintained at the same potential as the first lower ground 25. The second ground 14 is electrically connected to the first lower ground 25 by the side-surface metal layer 17, and is maintained at the same potential as the first lower ground 25.

The signal wire 12, the first ground 13, the second ground 14, the via conductor 16, and the side-surface metal layer 17 are manufactured using the same material and method as those in the manufacturing process of the wiring board 1 of the first embodiment.

In addition, the first lower ground 25 of the wiring board 2 according to the second embodiment is made by metalizing metal powder containing tungsten (W), molybdenum (Mo), manganese (Mn), silver (Ag), copper (Cu), or the like as a component. The first lower ground 25 is formed by printing and applying a metalized paste for the first lower ground 25 on a ceramic green sheet by a printing method such as a screen printing method, and firing the paste together with a powder compact formed by layering more than one ceramic green sheet, for example.

In addition, according to the second embodiment, the same operational effects as those of the first embodiment described above are obtained.

Another Aspect of Second Embodiment

Figure 10:
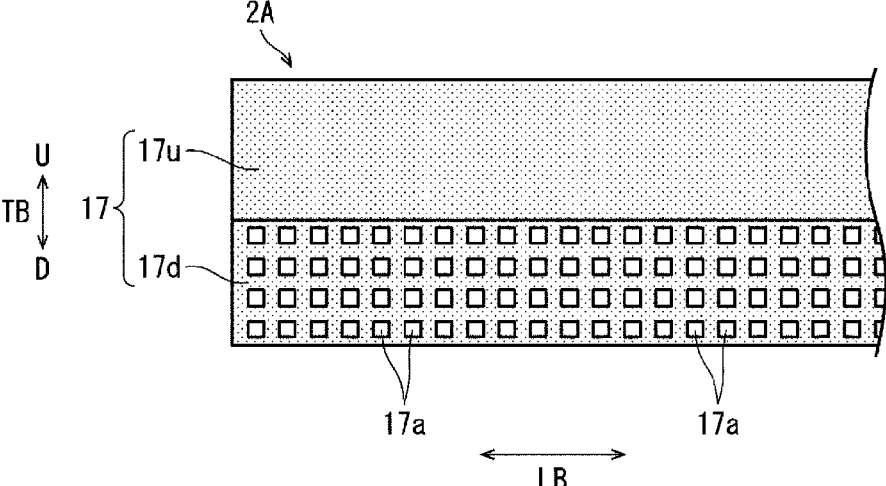
FIG. 10 is a schematic partial side view of a wiring board according to another aspect of the second embodiment as viewed from the second direction.

Another aspect of the second embodiment will be described with reference to FIG. 10. FIG. 10 is a schematic partial side view of a wiring board according to another aspect of the second embodiment as viewed from a second direction.

As in the example illustrated in FIG. 10, in a wiring board 2A according to another aspect of the second embodiment, the side-surface metal layer 17 may be divided into a first side-surface metal layer 17u located on a first surface 11u side (upper side) of the third surface 11s of the insulation substrate 11 and a second side-surface metal layer 17d located on a second surface 11d side (lower side) of the third surface 11s of the insulation substrate 11. A division point of the side-surface metal layer 17 is a tangent point or a tangent between the first lower ground 25 and the side-surface metal layer 17. The second side-surface metal layer 17d may be formed in, for example, a netlike shape or a perforated shape, and may have a plurality of openings 17a. An opening area fraction of the second side-surface metal layer 17d may be, for example, 80% or less. When the side-surface metal layer 17 has a plurality of openings 17a, it is possible to reduce creeping up of the bonding material 7 to the side-surface metal layer 17 and the second ground 14 in bonding of the insulation substrate 11 to the mounting substrate 6. Therefore, according to another aspect of the second embodiment, when the insulation substrate 11 is bonded to the mounting substrate 6, a difference in thermal expansion between both ends, in the second direction, of the insulation substrate 11 can be reduced to reduce an occurrence of cracking, chipping, or the like of the insulation substrate 11. In addition, according to another aspect of the second embodiment, when the lower ground 15 is bonded to the mounting substrate 6, it is possible to reduce floating of one side, in the second direction, of the insulation substrate 11. According to another aspect of the second embodiment, when the electronic device 100 (wiring board 2A) is used for, for example, an optical transceiver, it is possible to reduce an inclination or the like of the electronic device 100 with respect to an installation position of the electronic device 100, improving the reliability of the optical transceiver.

In addition, according to another aspect of the second embodiment, the same operational effects as those of the second embodiment described above are obtained.

Third Embodiment

Figure 11:
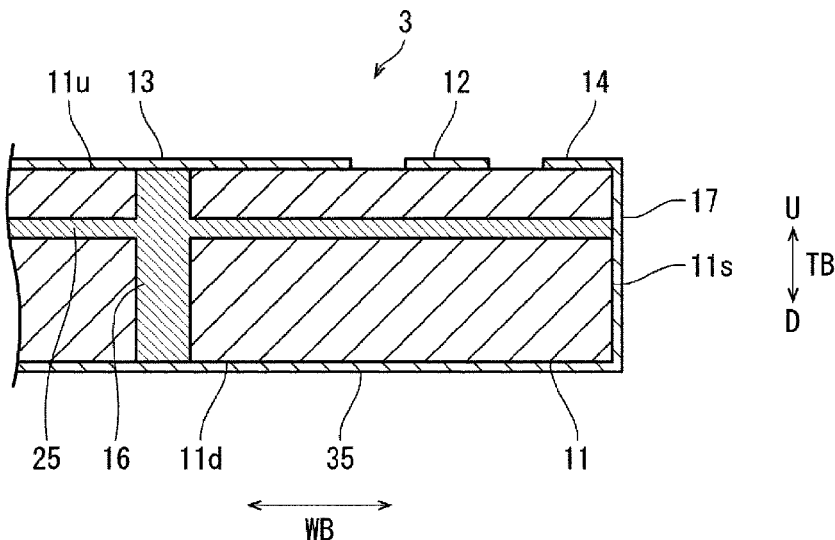
FIG. 11 is a schematic cross-sectional view of a wiring board according to a third embodiment, corresponding to FIG. 5.
Figure 12:
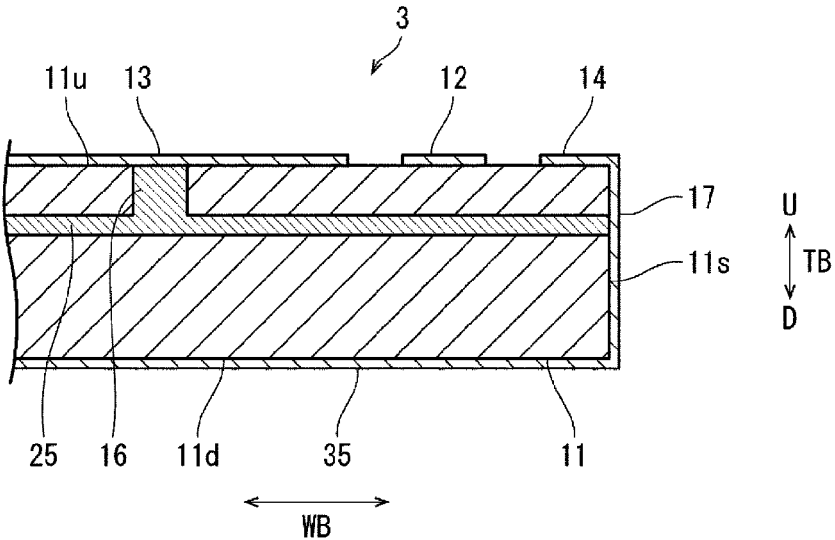
FIG. 12 is a schematic cross-sectional view of a wiring board according to another aspect of the third embodiment, corresponding to FIG. 5.

A third embodiment will be described with reference to FIGS. 11 and 12. FIG. 11 is a schematic cross-sectional view of a wiring board according to a third embodiment. FIG. 12 is a schematic cross-sectional view of a wiring board according to another aspect of the third embodiment.
(Configuration of Wiring Board 3)

As in the examples illustrated in FIGS. 11 and 12, a wiring board 3 according to the third embodiment has the same configuration as the wiring board 2 according to the second embodiment except for a part of the configuration. Among the configurations of the wiring board 3, a configuration different from that of the wiring board 2 will be described. For convenience of description, a member having the same function as a member described in the second embodiment is denoted by the same reference sign.

As illustrated in FIGS. 11 and 12, the wiring board 3 includes a first lower ground 25 and a second lower ground 35, as the lower ground. The second lower ground 35 is an example of the lower ground. In the wiring board 3, in addition to the first lower ground 25 being located inside the insulation substrate 11, the second lower ground 35 may be located on the second surface 11d of the insulation substrate 11. A part of the insulation substrate 11 is interposed between the signal wire 12 and the first lower ground 25, and a part of the insulation substrate 11 is interposed between the first lower ground 25 and the second lower ground 35. The second lower ground 35 may face the signal wire 12, the first ground 13, and the second ground 14 with the insulation substrate 11 interposed between the second lower ground 35 and the signal wire 12. In other words, the second lower ground 35 may overlap the signal wire 12, the first ground 13, the second ground 14, and the first lower ground 25 when the wiring board 1 is viewed in a plane perspective. The second lower ground 35 and the first lower ground 25 may be insulated therebetween by the insulation substrate 11. Therefore, according to the third embodiment, it is possible to strengthen the ground of the wiring board 3, further reducing the transmission loss of the signal transmitted by the signal wire 12.

As in the example illustrated in FIG. 11, each via conductor 16 may penetrate through the insulation substrate 11 along the third direction. In this case, each via conductor 16 may be connected to the first lower ground 25, and the lower end portion of each via conductor 16 may be connected to the second lower ground 35. In addition, as illustrated in FIG. 12, each via conductor 16 need not penetrate through the insulation substrate 11 along the third direction. In this case, each via conductor 16 may be connected to the first lower ground 25, and the lower end portion of each via conductor 16 need not be connected to the second lower ground 35.

The side-surface metal layer 17 may be located on the third surface 11s of the insulation substrate 11. The side-surface metal layer 17 may electrically connect the second ground 14, the first lower ground 25, and the second lower ground 35. A top edge portion of the side-surface metal layer 17 is connected to an edge portion (an edge portion closer to the third surface 11s) of the second ground 14. As in the example illustrated in FIGS. 11 and 12, the side-surface metal layer 17 may be connected to the edge portion of the first lower ground 25 exposed on the third surface 11s. A bottom edge portion of the side-surface metal layer 17 may be connected to an edge portion (an edge portion closer to the third surface 11s) of the second lower ground 35. The bottom edge portion of the side-surface metal layer 17 may overlap the edge portion of the second lower ground 35.

The wettability of the third surface 11s of the insulation substrate 11 with respect to the bonding material 7 that bonds the insulation substrate 11 to the mounting substrate 6 may be lower than the wettability of the second surface 11d of the insulation substrate 11 with respect to the bonding material 7. In this case, when the insulation substrate 11 is bonded to the mounting substrate 6, it is possible to reduce creeping up of the bonding material 7 to the side-surface metal layer 17 and the second ground 14. Therefore, when the insulation substrate 11 is bonded to the mounting substrate 6, a difference in thermal expansion between both ends, in the second direction, of the insulation substrate 11 can be reduced to reduce an occurrence of cracking, chipping, or the like of the insulation substrate 11. In addition, when the insulation substrate 11 is bonded to the mounting substrate 6, it is possible to reduce floating of one side, in the second direction, of the insulation substrate 11. When the electronic device 100 (wiring board 3) is used for, for example, an optical transceiver, it is possible to reduce an inclination or the like of the electronic device 100 with respect to an installation position of the electronic device 100, improving the reliability of the optical transceiver. In addition, when the side-surface metal layer 17 has the same configuration as the side-surface metal layer 17 of the wiring board 1A according to another aspect of the first embodiment, the same operational effects as those of the another aspect of the first embodiment are obtained. In the third embodiment of the present disclosure, the wettability of the second surface 11d of the insulation substrate 11 with respect to the bonding material 7 refers to the ease of wetting and spreading of the bonding material 7 on the second lower ground 35 located on the second surface 11d of the insulation substrate 11. In addition, the side-surface metal layer 17 may have the same configuration as the side-surface metal layer 17 of the wiring board 1A according to another aspect of the first embodiment.

Here, the second lower ground 35 is a metal layer containing titanium (Ti), platinum (Pt), gold (Au), or the like as a component, and is formed on the second surface (lower surface) of the sintered body whose surface has been polished, by a thin film forming method such as a vapor deposition method, an ion-plating method, or a sputtering method.

In addition, according to the third embodiment, the same operational effects as those of the second embodiment described above are obtained.

Another Aspect of Third Embodiment

Figure 13:
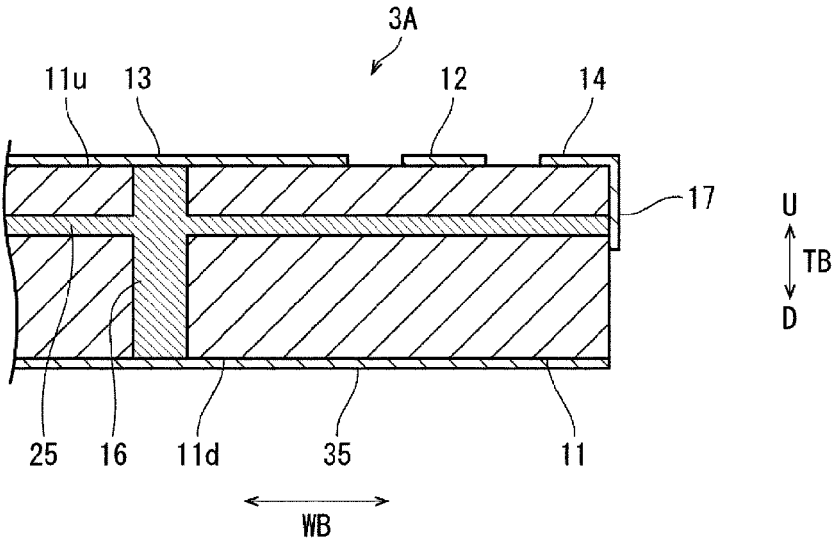
FIG. 13 is a schematic cross-sectional view of a wiring board according to another aspect of the third embodiment, corresponding to FIG. 5.
Figure 14:
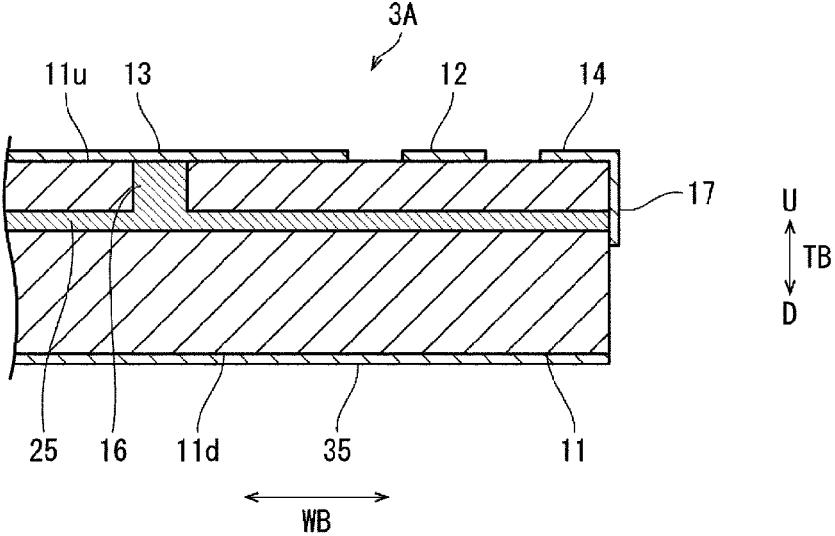
FIG. 14 is a schematic cross-sectional view of a wiring board according to another aspect of the third embodiment, corresponding to FIG. 5.
Figure 15:
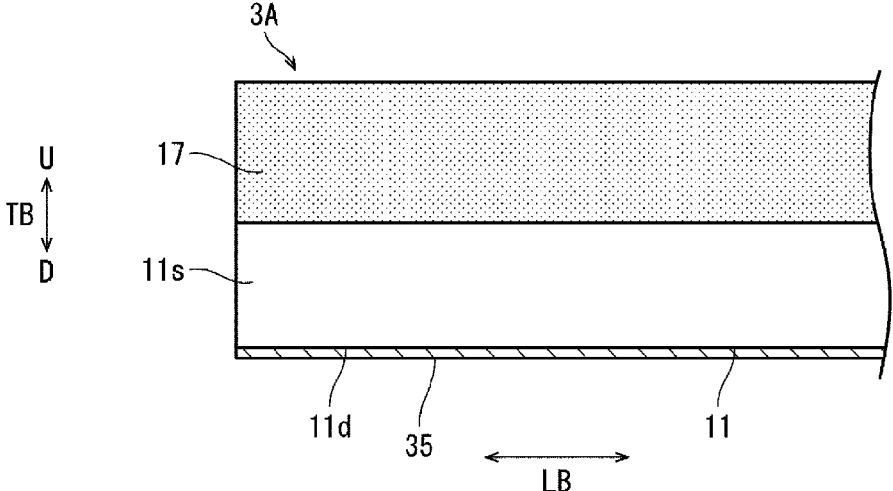
FIG. 15 is a schematic enlarged side view of the wiring board illustrated in FIG. 13.

Another aspect of the third embodiment will be described with reference to FIG. 13 to FIG. 15. FIG. 13 is a schematic cross-sectional view of a wiring board according to another aspect of the third embodiment, corresponding to FIG. 5. FIG. 14 is a schematic cross-sectional view of a wiring board according to another aspect of the third embodiment. FIG. 15 is a schematic enlarged side view of the wiring board illustrated in FIG. 13.

(Configuration of Wiring Board 3A)

As in the examples illustrated in FIGS. 13 to 15, a wiring board 3A according to another aspect of the third embodiment has the same configuration as the wiring board 3 according to the third embodiment except for a part of the configuration. Among the configurations of the wiring board 3A according to another aspect of the third embodiment, a configuration different from that of the wiring board 3 according to the third embodiment will be described. For convenience of description, a member having the same function as a member described in the third embodiment is denoted by the same reference sign.

In the examples illustrated in FIGS. 13 to 15, the side-surface metal layer 17 may be located only on an upper portion of the third surface 11s of the insulation substrate 11. A top edge portion of the side-surface metal layer 17 may be connected to an edge portion (an edge portion closer to the third surface 11*s*) of the second ground 14. The top edge portion of the side-surface metal layer 17 may overlap the edge portion of the second ground 14. As in the examples illustrated in FIGS. 13 to 15, the side-surface metal layer 17 may be connected to the edge portion of the first lower ground 25 exposed on the third surface 11*s*. In addition, as in the examples illustrated in FIGS. 13 to 15, a lower end portion of the side-surface metal layer 17 may be separated from an edge portion (an edge portion closer to the third surface 11*s*) of the second lower ground 35. The insulation substrate 11 may be exposed at a part (lower part) of the third surface 11*s*.

As in the example illustrated in FIG. 13, each via conductor 16 may penetrate through the insulation substrate 11 along the third direction. In addition, as in the example illustrated in FIG. 14, each via conductor 16 need not penetrate through the insulation substrate 11 along the third direction.

When the lower end portion of the side-surface metal layer 17 is separated from the edge portion of the second lower ground 35 and the insulation substrate 11 is exposed from a part of the third surface 11*s*, it is possible to reduce creeping up of the bonding material 7 to the side-surface metal layer 17 and the second ground 14 when the insulation substrate 11 is bonded to the mounting substrate 6 because the wettability of the insulation substrate 11 is low. Therefore, according to another aspect of the third embodiment, when the insulation substrate 11 is bonded to the mounting substrate 6, a difference in thermal expansion between both ends, in the second direction, of the insulation substrate 11 can be reduced to reduce an occurrence of cracking, chipping, or the like of the insulation substrate 11. In addition, according to the present variation, when the insulation substrate 11 is bonded to the mounting substrate 6, it is possible to reduce floating of one side, in the second direction, of the insulation substrate 11. According to another aspect of the third embodiment of the present disclosure, when the electronic device 100 (wiring board 3A) is used for, for example, an optical transceiver, it is possible to reduce an inclination or the like of the electronic device 100 with respect to an installation position of the electronic device 100, improving the reliability of the optical transceiver.

In addition, according to another aspect of the third embodiment, the same operational effects as those of the third embodiment described above are obtained.

The invention according to the present disclosure has been described above based on the drawings and the examples. However, the invention according to the present disclosure is not limited to the above-described embodiments. That is, the invention according to the present disclosure may be varied in diverse manners within the scope described in the present disclosure, and an embodiment obtained by appropriately combining technical means disclosed in different embodiments is also included in the technical scope of the invention according to the present disclosure. That is, note that one skilled in the art can easily make various variations or modifications based on the present disclosure. Also note that these variations or modifications are included in the scope of the present disclosure.

REFERENCE SIGNS

100 Electronic device
1 Wiring board (wiring board according to first embodiment of the present disclosure)
5 Electronic component

6 Mounting substrate
7 Bonding material
11 Insulation substrate
11*u* First surface
11*d* Second surface
11*s* Third surface
11*c* Center position
12 Signal wire
13 First ground
14 Second ground
15 Lower ground
16 Via conductor
17 Side-surface metal layer
17*a* Opening
1A wiring board (wiring board according to another aspect of the first embodiment of the present disclosure)
17*u* First side-surface metal layer
17*d* Second side-surface metal layer
2 Wiring board (wiring board according to second embodiment of the present disclosure)
25 First lower ground
3 Wiring board (wiring board according to third embodiment of the present disclosure)
35 Second lower ground
3A Wiring board (wiring board according to another aspect of third embodiment of the present disclosure)

The invention claimed is:

1. A wiring board comprising:
an insulation substrate comprising a first surface, a second surface located opposite to the first surface, and a third surface connected to each of the first surface and the second surface;
a signal wire located on the first surface and extending in a first direction;
a first ground located farther away from the third surface than the signal wire is and a second ground located closer to the third surface than the signal wire is, the first ground and the second ground being located on the first surface with the signal wire interposed between the first ground and the second ground;
a first lower ground located inside the insulation substrate;
a second lower ground located at least one of on the second surface of the insulation substrate; and
a via conductor located inside the insulation substrate and electrically connecting the first ground and the first lower ground, and
wherein thickness of the first lower ground is greater than thickness of the first ground.

2. The wiring board according to claim 1, wherein the signal wire is located close to the third surface with respect to a center position of the insulation substrate in a second direction orthogonal to the first direction.

3. The wiring board according to claim 1, wherein the via conductor comprises a plurality of via conductors, and the plurality of via conductors are arranged along the signal wire.

4. The wiring board according to claim 1, wherein
the first lower ground is located closer to the first surface than to the second surface, and
a part of the insulation substrate is interposed between the first lower ground and the signal wire.

5. The wiring board according to claim 1, further comprises:
a side-surface metal layer located on the third surface, and
wherein the side-surface metal layer electrically connects and the first lower ground and the second ground.

6. The wiring board according to claim 5, wherein the side-surface metal layer comprises a plurality of openings.

7. The wiring board according to claim 5, wherein the side-surface metal layer is separated from the second lower ground, and the insulation substrate is exposed at a part of the third surface.

8. The wiring board according to claim 1, wherein wettability of the third surface with respect to a bonding material that bonds the insulation substrate to a mounting substrate is lower than wettability of the second surface with respect to the bonding material.

9. An electronic device comprising:

the wiring board according to claim 1;

an electronic component mounted on the wiring board;

a bonding material located on the second surface of the insulation substrate; and a mounting substrate bonded to the wiring board via the bonding material.

10. The wiring board according to claim 1, wherein the first lower ground is exposed on the third surface.

11. The wiring board according to claim 1, wherein the via conductor penetrates through the first lower ground and connects to the second lower ground.

12. The wiring board according to claim 1, wherein the via conductor is integrated with the first lower ground.

13. The wiring board according to claim 1, wherein a portion the signal wire is curved.

14. The wiring board according to claim 1, wherein the insulation substrate includes fourth surfaces that are side surfaces distinct from the third surface, and the first lower ground does not extend to the fourth surfaces.

\*   \*   \*   \*   \*